United States Patent
Hsieh et al.

(10) Patent No.: US 10,483,322 B2
(45) Date of Patent: Nov. 19, 2019

(54) MEMORY DEVICE AND METHOD FOR FABRICATING THE SAME

(71) Applicant: TAIWAN SEMICONDUCTOR MANUFACTURING CO., LTD., Hsinchu (TW)

(72) Inventors: Ching-Pei Hsieh, Kaohsiung (TW); Hsia-Wei Chen, Taipei (TW); Yu-Wen Liao, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/617,019

(22) Filed: Jun. 8, 2017

(65) Prior Publication Data

US 2018/0358409 A1    Dec. 13, 2018

(51) Int. Cl.
| | |
|---|---|
| *H01L 27/24* | (2006.01) |
| *H01L 45/00* | (2006.01) |
| *H01L 23/528* | (2006.01) |

(52) U.S. Cl.
CPC ...... *H01L 27/2463* (2013.01); *H01L 27/2436* (2013.01); *H01L 45/08* (2013.01); *H01L 45/1233* (2013.01); *H01L 45/1253* (2013.01); *H01L 45/145* (2013.01); *H01L 45/146* (2013.01); *H01L 45/1675* (2013.01)

(58) Field of Classification Search
CPC . H01L 27/2463; H01L 27/2436; H01L 45/08; H01L 45/1233; H01L 45/1608
See application file for complete search history.

(56) References Cited

U.S. PATENT DOCUMENTS

| | | | | |
|---|---|---|---|---|
| 7,358,520 | B2 * | 4/2008 | Pinnow | H01L 27/2436 257/2 |
| 9,401,371 | B1 * | 7/2016 | Lee | H01L 27/11582 |
| 2005/0170589 | A1 * | 8/2005 | Lee | H01L 27/112 438/278 |
| 2006/0163554 | A1 * | 7/2006 | Lankhorst | H01L 45/06 257/4 |
| 2008/0153224 | A1 * | 6/2008 | Wang | H01L 27/115 438/257 |
| 2014/0021584 | A1 * | 1/2014 | Tu | H01L 27/10894 257/532 |
| 2014/0252295 | A1 * | 9/2014 | Liao | H01L 45/04 257/2 |
| 2016/0204118 | A1 * | 7/2016 | Wu | H01L 29/7881 257/316 |
| 2017/0162592 | A1 * | 6/2017 | Nishikawa | H01L 27/11573 |
| 2018/0331282 | A1 * | 11/2018 | Zhu | H01L 45/1233 |

* cited by examiner

*Primary Examiner* — Christine A Enad
(74) *Attorney, Agent, or Firm* — McClure, Qualey & Rodack, LLP (57) ABSTRACT

A memory device includes a first inter-layer dielectric layer, plural conductive features, plural memory structures, a filler, and a second inter-layer dielectric layer. The conductive features are embedded in the first inter-layer dielectric layer. The memory structures are respectively over the conductive features. The filler is in between the memory structures. The second inter-layer dielectric layer is over the filler and the memory structures, and the second inter-layer dielectric layer and the filler form an interface, in which the interface extends from one of the memory structures to another of the memory structures.

20 Claims, 11 Drawing Sheets

MEMORY DEVICE AND METHOD FOR FABRICATING THE SAME

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, RRAM cell includes a resistive material layer, the resistance of which can be adjusted to represent logic "0" or logic "1."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-15B illustrate intermediate stages in the formation of a memory device according to some embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random-access memory (RRAM) device and the method of forming the same are provided in accordance with various exemplary embodiments. The intermediate stages of forming the RRAM device are illustrated. The variations of the embodiments are discussed. Throughout the various views and illustrative embodiments, like reference numbers are used to designate like elements.

Figure 1:
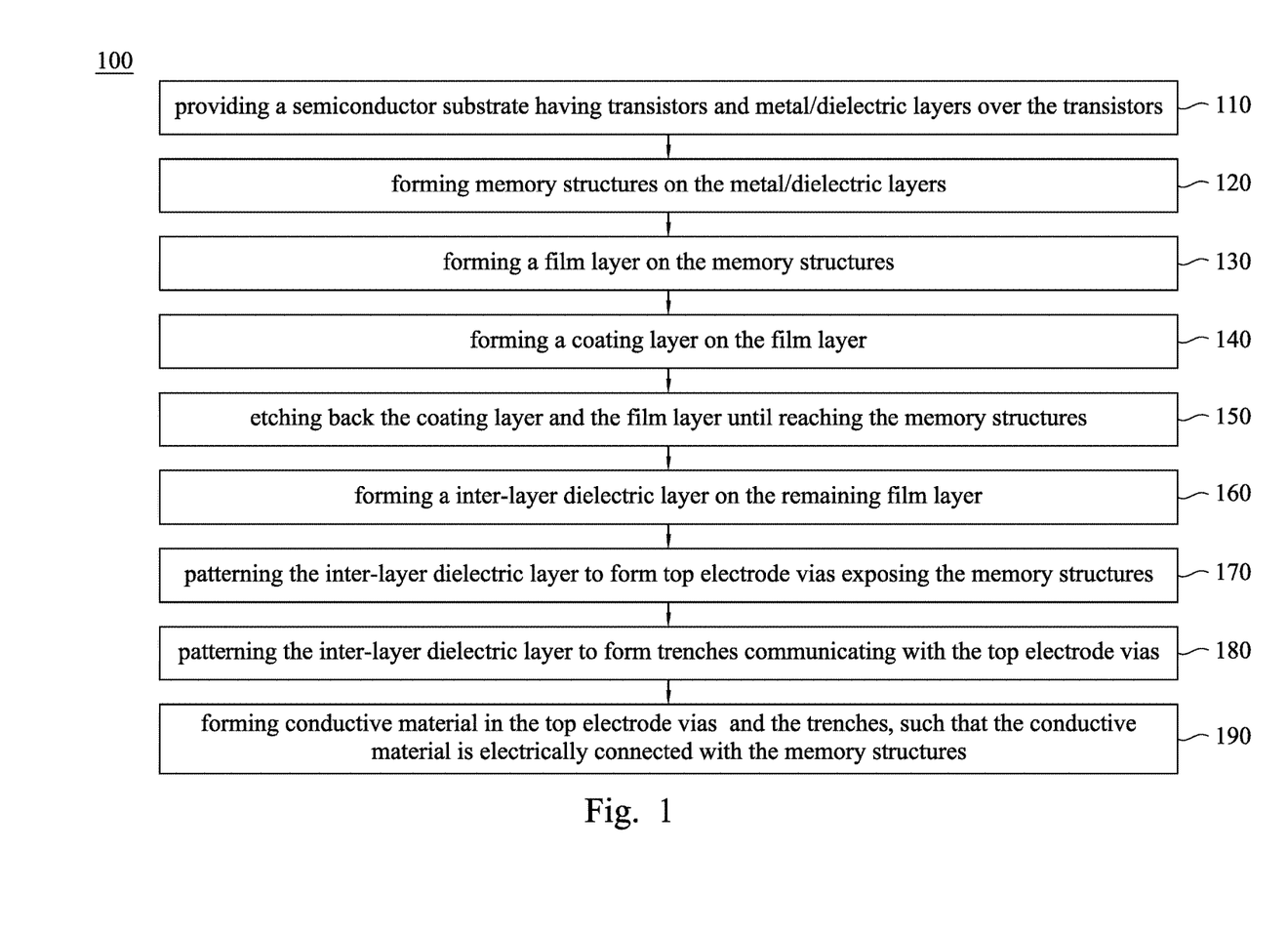
FIG. 1 is a flow chart of a method for forming a memory device according to some embodiments of the present disclosure.

FIG. 1 is a flow chart of a method 100 for forming a memory device according to some embodiments of the present disclosure. FIGS. 2-15B illustrate intermediate stages in the formation of a memory device according to some embodiments of the present disclosure. Various operations of the method 100 are discussed in association with FIGS. 2-15B.

Figure 2:
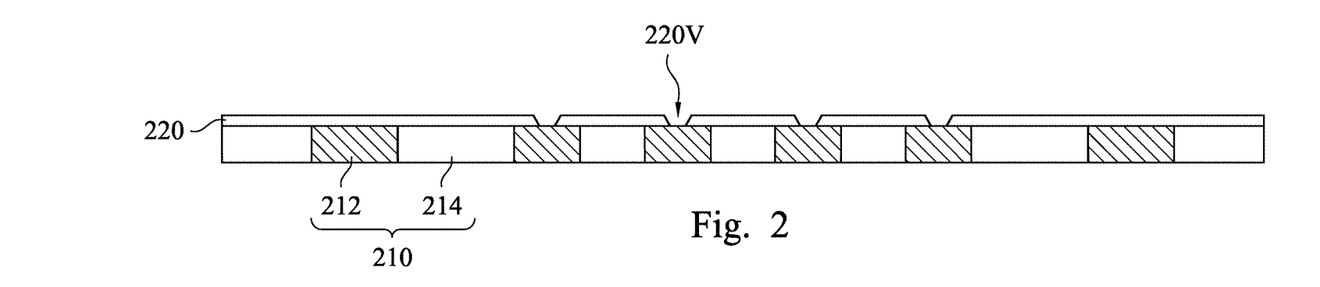

In operation 110 of method 100, as shown in FIG. 2, a semiconductor substrate having transistors and one or more metal/dielectric layers 210 over the transistors is provided. The semiconductor substrate may be a silicon substrate. Alternatively, the substrate may comprise another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. In the present disclosure, a wafer is a workpiece that includes a semiconductor substrate and various features formed in and over and attached to the semiconductor substrate. The wafer may be in various stages of fabrication and is processed using the CMOS process. The transistors are formed by suitable transistor fabrication processes and may be a planar transistor, such as polysilicon gate transistors or high-k metal gate transistors, or a multi-gate transistor, such as fin field effect transistors. After the transistors are formed, one or more metal/dielectric layers 210 of a multi-level interconnect (MLI) is formed over the transistors. The metal/dielectric layer 210 includes one or more conductive features 212 embedded in inter-layer dielectric (ILD) layer 214.

Herein, after the formation of the metal/dielectric layer 210, a first memory stop layer 220 is formed on the metal/dielectric layer 210. The first memory stop layer 220 may be silicon carbide, silicon oxynitride, silicon nitride, carbon doped silicon nitride or carbon doped silicon oxide. The first memory stop layer 210 is selected to have a chemical mechanical polishing (CMP) resistance property different from that of a bottom electrode material formed in subsequent processes. The first memory stop layer 220 is deposited over the metal/dielectric layer 210 using a chemical vapor deposition (CVD) process such as plasma enhanced (PE) CVD, high-density plasma (HDP) CVD, inductively-coupled-plasma (ICP) CVD, or thermal CVD. Bottom electrode vias 220V are etched into the first memory stop layer 220. The bottom electrode vias 220V are formed by first depositing a photoresist over the first memory stop layer 220, exposing a portion of the photoresist to a radiation, developing the photoresist, and etching the bottom electrode vias 220V in the first memory stop layer 220 using the photoresist as an etch mask.

In operation 120 of method 100, as shown in FIGS. 3-6, memory structures 300 are formed on the metal/dielectric layer 210. In some embodiments, the memory structures 300 are respectively over the conductive features 212. In some embodiments, the memory structures 300 are above the inter-layer dielectric layer 214 and respectively electrically connected to the conductive features 212. Herein, at least one of the memory structures 300 includes a bottom electrode layer 310, a resistive material layer 320, a capping layer 330, a top electrode 340, a hardmask layer 350, and spacers 360, and the formation processes are illustrated below.

Figures 3, 4:
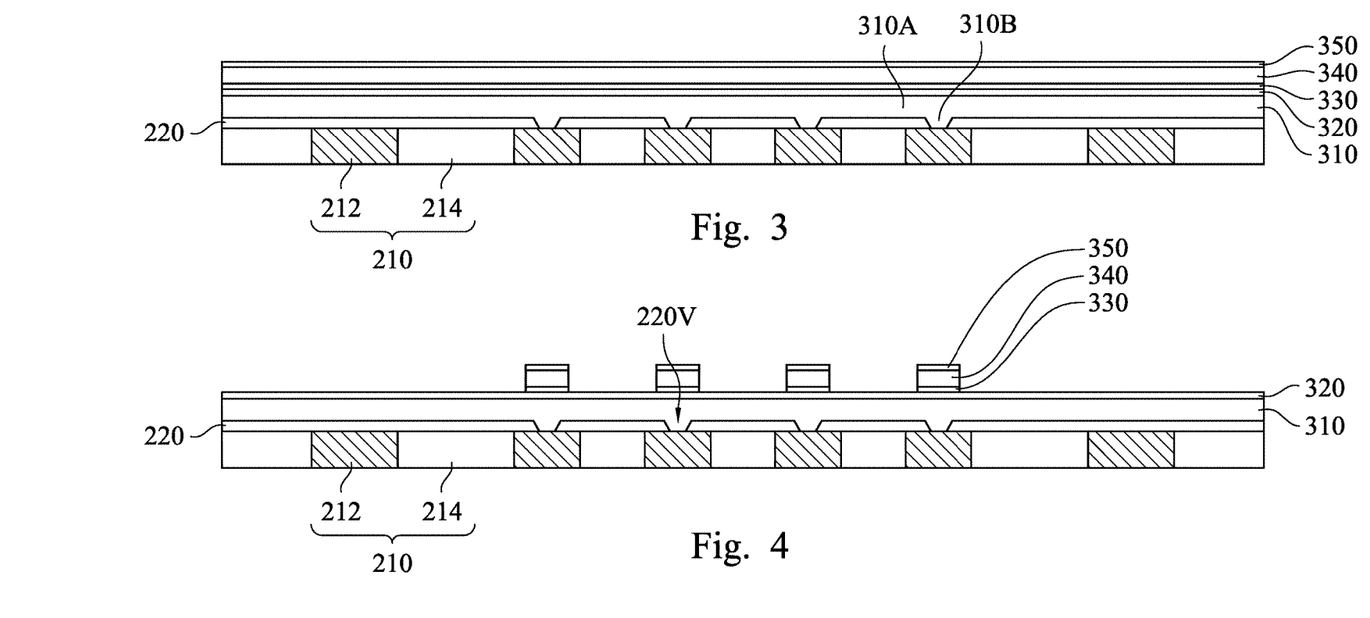

Reference is made to FIG. 3. The bottom electrode layer 310 is deposited in the bottom electrode vias 220V and over the first memory stop layer 220. The bottom electrode layer 310 may be tantalum nitride, titanium nitride, tungsten, titanium, tantalum or copper deposited using a physical vapor deposition (PVD) process or a plating process. In some cases, a liner or a barrier layer may be deposited first, followed by a deposition of the bulk material using deposition methods. In some embodiments, the bottom electrode layer 310 is planarized. The bottom electrode layer 310 includes a top portion 310A and via portion 310B. After the planarization, the top surface of the top portion 310A is substantially planar. The high uniformity of the top portion 310A of the bottom electrode layer 310 may be advantageous to provide a substantially uniform electric field during operation and to increase the accuracy of the memory cell. In some embodiments, the bottom electrode layer 310 has a thickness ranging from about 100 angstroms to about 1000 angstroms.

Then, the resistive material layer 320, the capping layer 330, the top electrode 340, and the hardmask layer 350 are subsequently formed on the bottom electrode layer 310. The resistive material layer 320 is a metal oxide, which may be hafnium oxide, zirconium oxide, aluminum oxide, nickel oxide, tantalum oxide, titanium oxide, and other oxides used as a resistive material layer. The metal oxide may have a non-stoichiometric oxygen to metal ratio. Depending on the method of deposition, the oxygen to metal ratio and other process conditions may be tuned to achieve specific resistive material layer 320 properties. For example, a set of conditions may yield a low 'forming' voltage and another set of conditions may yield a low 'read' voltage. The metal oxide may be deposited. In some embodiments, the metal oxide is a transition metal oxide. In other embodiments, the resistive material layer is a metal oxynitride.

The resistive material layer 320 may be formed by a suitable technique, such as atomic layer deposition (ALD) with a precursor containing a metal and oxygen. Other chemical vapor deposition (CVD) techniques may be used. In another example, the resistive material layer 320 may be formed by a physical vapor deposition (PVD), such as a sputtering process with a metallic target and with a gas supply of oxygen and optionally nitrogen to the PVD chamber. In yet another example, the resistive material layer 320 may be formed an electron-beam deposition process. The resistive material layer 320 may have a thickness ranging between about 10 angstroms and about 100 angstroms. Thicker resistive material layer 320 results in higher forming voltage. However, a thin resistive material layer 320 may be susceptible to current leakage if over etched and is more sensitivity to surface and thickness non-uniformity.

In various embodiments, the capping layer 330 over the resistive material layer 320 is a metal, for example, titanium, hafnium, platinum, ruthenium or tantalum. In some embodiments, the capping layer may include hafnium oxide, aluminum oxide, tantalum oxides, other metal oxidation composite films, or the combination thereof. The capping layer 330 may be deposited using a PVD process, a CVD, or an ALD process. The capping layer 330 may have a thickness ranging between about 10 angstroms and about 100. In some embodiments, a thickness of a combination of the resistive material layer 320 and the capping layer 330 ranges from about 10 angstroms to about 100 angstroms.

The top electrode 340 may be metal, metal-nitride, doped polysilicon or other suitable conductive material. For example, the top electrode 340 may be tantalum nitride, titanium nitride, titanium, tantalum or platinum. The top electrode 340 may single or bilayer. The top electrode 340 may be formed by PVD, CVD, ALD, or other suitable technique and has a thickness ranging between about 100 angstrom and about 1000 angstroms. Alternatively, the top electrode 340 includes other suitable conductive material to electrically connect the device to other portion of an interconnect structure for electrical routing.

The hardmask layer 350 is used for defining layers of the memory structures 300 subsequently. The hardmask layer 350 may be made of silicon nitride, silicon carbide, or other composite dielectric films. In some embodiments, a silicon oxynitride is used. Silicon oxynitride has a good etch selectivity against the bottom electrode metal. Other hardmask material including silicon carbide, carbon-doped silicon nitride, or silicon nitride may be used.

Reference is made to FIG. 4. The capping layer 330, the top electrode 340, and the hardmask layer 350 are patterned. Herein, the hardmask layer 350 overlying the top electrode 340 is patterned first. The patterning includes a photolithography operation where a photoresist is deposited, a pattern is defined by exposing photoresist to a radiation, and developing the photoresist to create a photoresist pattern. The photoresist pattern is then used as an etch mask to protect desired portions of the hardmask layer 350. The hardmask layer 350 may then be patterned using an etching operation. In some embodiments, an etchant used to pattern the hardmask layer 350 comprises an etching chemistry comprising gases of $CF_4$, $CH_2F_2$ and/or other chemicals. The photoresist mask is removed after the patterning. In some embodiments, the photoresist mask can be removed by adding oxygen to the etchant.

Subsequently, the patterned hardmask layer 350 is used as an etchmask to pattern the top electrode 340 and the capping layer 330. In some embodiments, an etchant is applied to etch an exposed portion of the top electrode 340 and the capping layer 330 that is not covered by the patterned hardmask layer 350. Thus, sidewalls of the hardmask layer 350, the top electrode 340, and the capping layer 330 are substantially vertically aligned. In some embodiments, the capping layer 330 and the top electrode 340 may be formed of the same material, but using different processes so as to vary a specific material property. In other embodiments, the capping layer 330 is a metal and the top electrode 340 is a metal nitride, for example, the capping layer 330 may be titanium and the top electrode 340 may be a tantalum nitride. The etch process stops when the resistive material layer 320 is reached. Techniques are available to detect the end of etching when a new material layer is reached so as to reduce the amount of over etching. Because the resistive material layer 320 may be thin, a large amount of over etching cannot be tolerated because the resistive material layer 320 would be removed or damaged.

Figure 5:
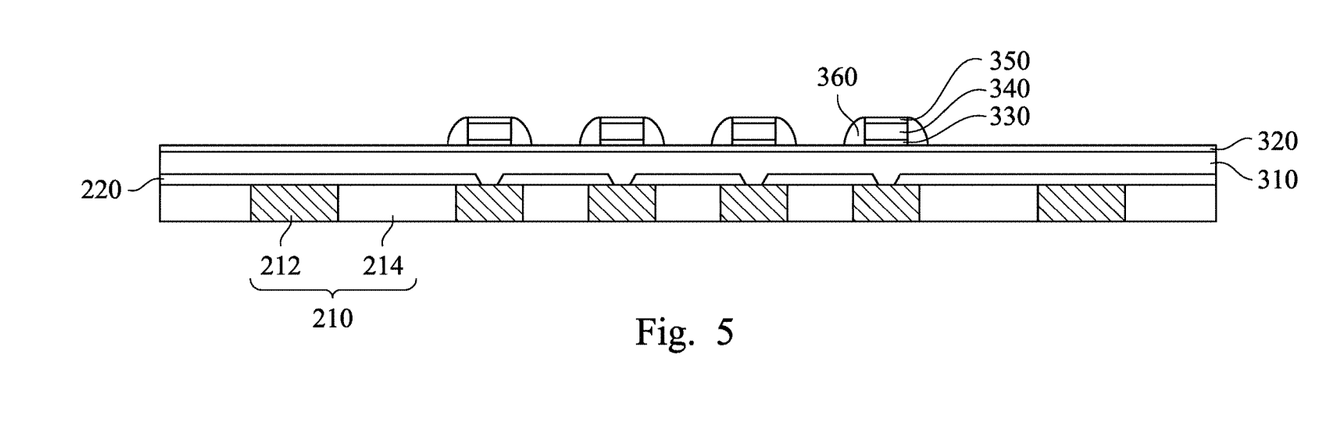

Reference is made to FIG. 5. The spacer 360 is formed around the remaining capping layer 330, the top electrode 340, and the hardmask layer 350. The spacer 360 may be made of silicon nitride, silicon oxynitride, and silicon oxide. The spacer 360 may be formed by conformally coating a spacer material covering the top and sidewalls of the hardmask layer 350, the top electrode 340 and capping layer 330, and then etching the spacer material. Because of the shape of the conformal deposition, the spacer material over the hardmask layer 350 is removed during this etch, and left the spacer 360. The spacer 360 surrounds the hardmask layer 350, the top electrode 340, and the capping layer 330, and thus protects them against subsequent etch operations. The height and width of spacer 360 after etching may be tuned by adjusting deposition and etching parameters.

According to various embodiments, the spacer etching is performed without patterning first because the shape of the conformal spacer material can be etched to form the spacer 360. However, other spacer shapes may be formed by patterning the spacer material first before etching. If a pattern is used, the spacer 360 may be formed of suitable shapes. For example, the spacer 360 may include a portion over the hardmask layer 350 and the top corners of the hardmask layer 350 so as to further protect the memory structure during bottom electrode etch.

Figure 6:
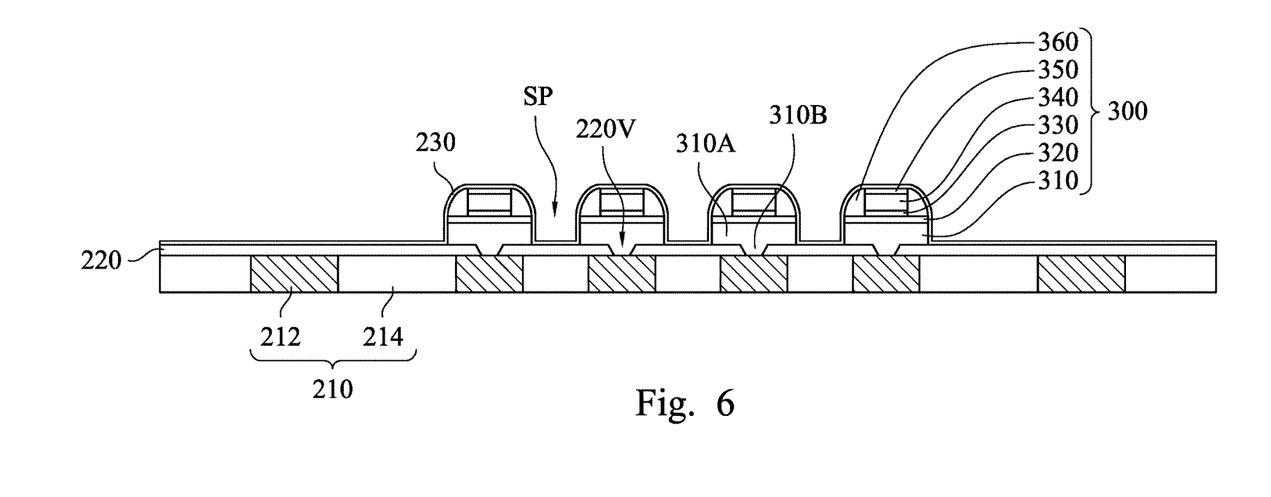

Then, reference is made to FIG. 6. The resistive material layer 320 and the bottom electrode layer 310 are patterned. The spacer 360 and the hardmask layer 350 are used as an etch mask to remove a portion of the resistive material layer 320 and bottom electrode layer 310. Through the steps, the memory structures 300 including the bottom electrode layer 310, the resistive material layer 320, the capping layer 330, the top electrode 340, the hardmask layer 350, and the spacers 360 are formed. The memory structures 300 are spaced apart by a gap SP.

Then, a second memory stop layer 230 is conformally formed over the memory structures 300. The second memory stop layer 230 may be the same material as the first memory stop layer 220. The second memory stop layer 230 may be silicon carbide, silicon oxynitride, silicon nitride, carbon doped silicon nitride or carbon doped silicon oxide. The second memory stop layer 230 is selected to have a different etch selectivity than overlying dielectric layer material formed in later processes. The second memory stop layer 230 is deposited conformally over the memory structures 300 using a chemical vapor deposition (CVD) process such as plasma enhanced (PE) CVD, high-density plasma (HDP) CVD, inductively-coupled-plasma (ICP) CVD, or thermal CVD.

Figure 7:
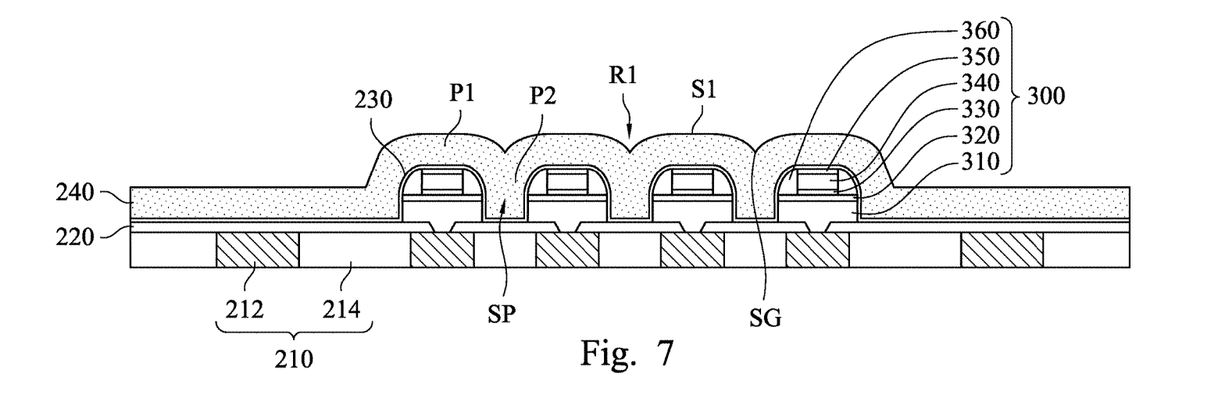

In operation 130 of method 100 in accordance with FIG. 7, a film layer 240 is formed on the memory structures 300. The film layer 240 is conformally formed over the second memory stop layer 230. To be specific, the film layer 240 has raised portions P1 over the memory structures 300 respectively and recessed portions P2 in the gap SP between the memory structures 300. Therefore, the film layer 240 has an uneven top surface S1, and has at least one recess R1 between neighboring raised portions P1 and above the gap SP. The film layer 240 may be made of tetra-ethyl-ortho-silicate (TEOS) or other suitable dielectric materials, as examples. The film layer 240 may be deposited conformally over the second memory stop layer using a CVD, plasma enhanced CVD (PECVD), PVD, or other suitable technique. In some embodiments, the thickness of the film layer 240 may be greater than a total thickness of the bottom electrode layer 310 and the resistive material layer 320.

Figure 8:
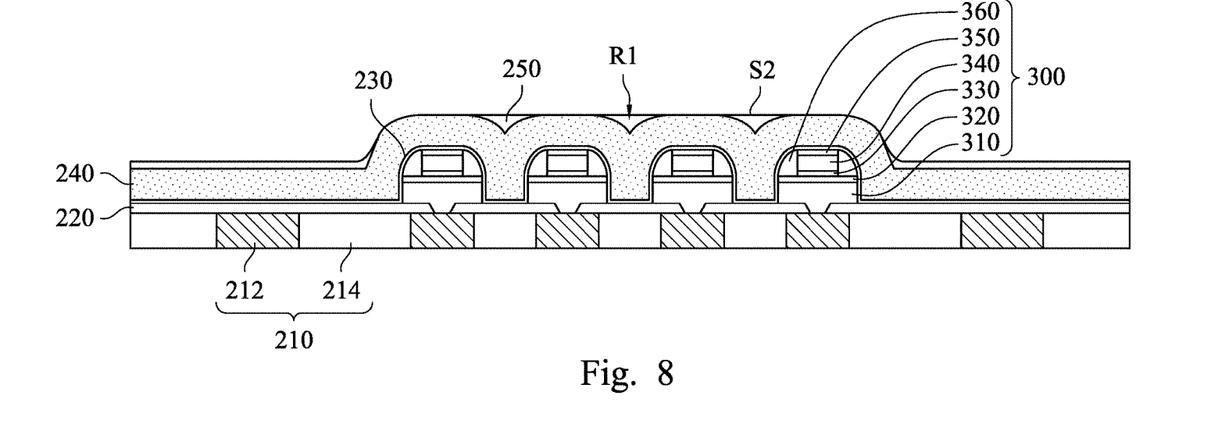

In operation 140 of method 100, as shown in FIG. 8, a coating layer 250 is formed on the film layer 240 to fill the recesses R1. The coating layer 250 is formed over the film layer 240 using a coating process (e.g., a spin coating process). Such a coating process may be advantageous to form a non-conformal layer over an uneven surface, and hence the coating layer 250 may be non-conformally formed over the uneven top surface S1 of the film layer 240. Such a non-conformal formation of the coating layer 250 makes top and bottom surfaces of the coating layer 250 have different geometries. As such, in some embodiments where the bottom surface of the coating layer 250 is conformal to the uneven top surface S1 of the film layer 240, the non-conformal formation may be advantageous to form the top surface of the coating layer 250 with less curvature than that of the uneven top surface S1 of the film layer 240. Therefore, the coating layer 250 can have a substantially planar top surface S2. To be specific, the top surface S2 of the coating layer 250 is more planar than the top surface S1 of the film layer 240.

In some embodiments of the present disclosure, a flowable material can be spin-coated over the film layer 240. The flowable material includes a material of the coating layer 250 such as bottom anti-reflective coating (BARC) or photoresist. In some embodiments, the spin-coating process may include multi-steps with different spin speeds in each step to achieve a desired profile for the top surface S2 of the coating layer 250. After the spin coating process, the flowable material can be cured. Curing the flowable material hardens the coating layer 250. In some embodiments, curing the flowable material comprises exposing the flowable material to an elevated temperature. In some embodiments, the spin coating process and the curing process may be performed in separate processing chambers (i.e. performed ex-situ). In other embodiments, the spin coating process and the curing process may be performed in-situ.

Figure 9:
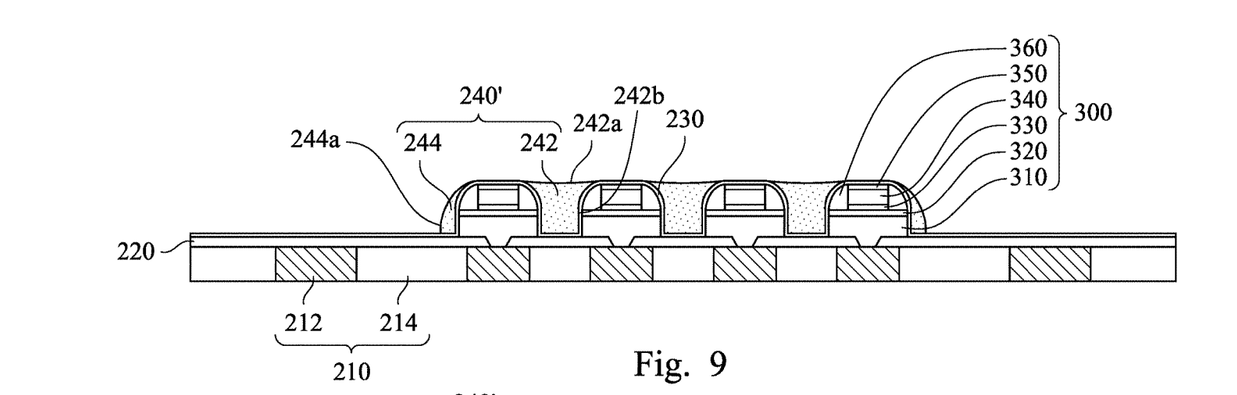

In operation 150 of method 100, as shown FIG. 8 and FIG. 9, the coating layer 250 and the film layer 240 are etched back until reaching the second memory stop layer 230 of the memory structures 300. In some embodiments, an etching rate of the coating layer 250 and an etching rate of the film layer 240 during the etching back are substantially the same. In other words, the coating layer 250 and the film layer 240 can have substantially the same etch resistance to the etching back. Stated differently, the etchant used in the etching back can be chosen such that the coating layer 250 and the film layer 240 can have substantially the same etch resistance to this etchant. For example, in some embodiments where the coating layer 250 is made of BARC and the film layer 240 is made of TEOS, an etchant used in the etching back may comprise $CF_4$, $CHF_3$, $CH_2F_2$, and/or other chemicals.

As illustrated in FIG. 9, the coating layer 250 and a portion of the film layer 240 are removed by the etching back. After the etching back, the remaining film layer 240' has a filler 242 present in between the memory structures 300 and a spacer 244 abutting one of the memory structures 300. For example, the spacer 244 may be at a side of the outermost one of the memory structures 300. In some embodiments, a sidewall 244a of the spacer 244 extends from a top surface of the memory structure 300 to a horizontal portion of the second memory stop layer 230 over the first memory stop layer 220. In some embodiments, the spacer 244 is at the first side of the outermost one of the memory structures 300, a filler 242 is at the second side of the outermost one of the memory structures 300, and the first side is opposite to the second side. In some embodiments of the present disclosure, the spacer 244 and the filler 242 are made of the same material because they are formed from the film layer 240 (see FIG. 8).

In some embodiments, the filler 242 has a top surface 242a and opposite sidewalls 242b. The top surface 242a has edges respectively in contact with portions of the second memory stop layer 230 of the memory structures 300. The sidewalls 242b are respectively in contact with the memory structures 300, and hence the sidewalls 242b are concave to fit the convex profile of the second memory stop layer 230 of the memory structures 300. In some embodiments, the top surface 242a may be a curved surface if the coating layer 250 and the film layer 240 have slightly different etching rates during the etching back. For example, the top surface 242a is a concave surface, and hence a bottom of the top surface 242a of the filler 242 is in a position not higher than a top of one of the memory structures 300. Specifically, the bottom of the top surface 242a of the filler 242 is in a position lower than tops of the memory structures 300.

In some embodiments, the concave top surface 242a of the filler 242 is free of a singularity. It is noted that, as illustrated in FIG. 7, the uneven top surface S1 of the film layer 240 includes singularities SG due to topography of the memory structures 300 raised above the metal/dielectric layer 210. That is, the singularities SG are over the gaps SP between neighboring memory structures 300. However, since an etching back process is performed to the film layer 240 after that the recesses R1 in the uneven top surface S1 are filled the coating layer 250, the top surface 242a of the resulting film layer 240' can be free of a singularity, as illustrated in FIGS. 8-9. When a conductive material is formed over the film layer 240' in a subsequent process, absence of singularity in the top surface 242a may be advantageous to prevent the conductive material from forming in between the memory structures 300, and hence unwanted electrical issues (e.g. unwanted parasitic capacitance) caused by the conductive material formed in between the memory structures 300 can be prevented.

Herein, the second memory stop layer 230 is the outermost layer of the memory structures 300, and the etching back stops when reaching the second memory stop layer 230. In some other embodiments, the second memory stop layer 230 is not formed before the etching back process. Alternatively, the second memory stop layer 230 is formed after the etching back process.

Figure 10:
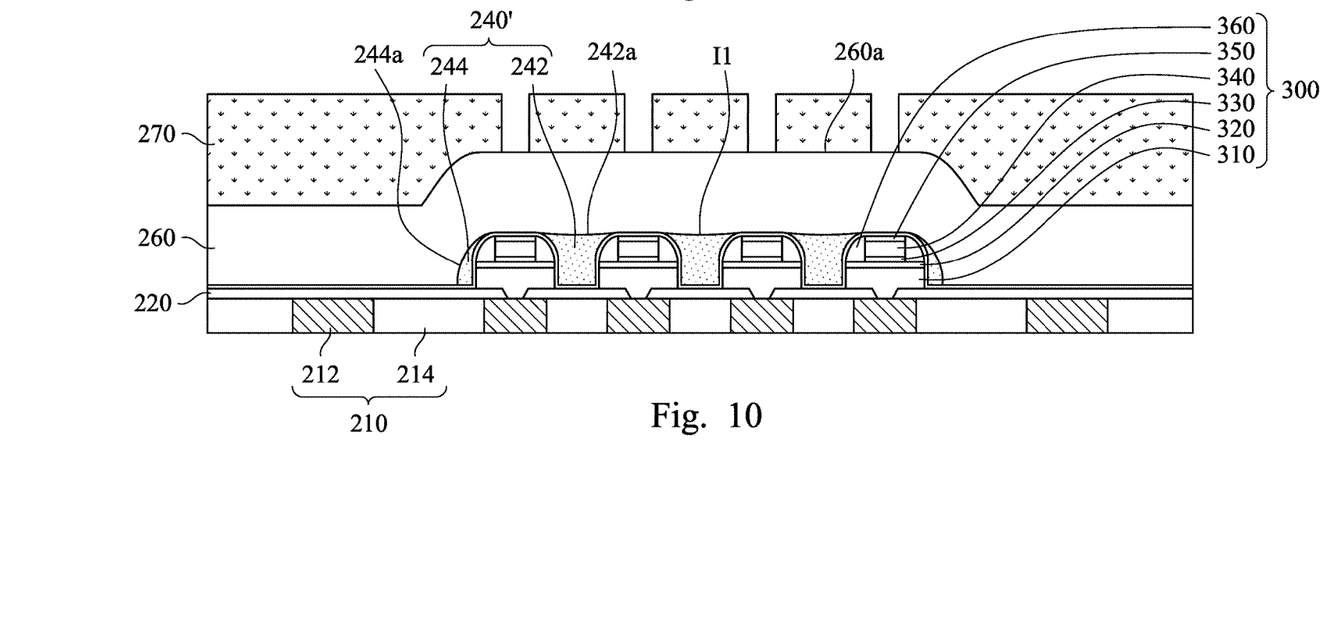

In operation 160 of the method 100, as shown in FIG. 10, an inter-layer dielectric layer 260 is deposited over the metal/dielectric layer 210, the remaining film layer 240', and the memory structures 300 using suitable deposition techniques. The inter-layer dielectric layer 260 is present on the sidewall 244a of the spacer 244 and the top surface 242a of the filler 242. The inter-layer dielectric layer 260 may be the same material as the inter-layer dielectric layer 214 in the metal/dielectric layer 210. The inter-layer dielectric layer 260 may be silicon oxide, extreme or extra low-k silicon oxide such as a porous silicon oxide layer, or other commonly used inter-layer dielectric material. In some embodiments, the filler 242 and the spacer 244 are made of a dielectric material different from the materials of the overlying inter-layer dielectric layer 260 and the underlying inter-layer dielectric layer 214.

In some embodiments, the inter-layer dielectric layer 260 and the filler 242 forms an interface I1, the interface I1 extends from one of neighboring memory structures 300 to another of the neighboring memory structures 300. Since the inter-layer dielectric layer 260 is in contact with the top surface 242a of the filler 242, the interface I1 have the same profile as the top surface 242a. For example, the interface I1 may be a curved surface, and curving of the interface I1 begins from one of the neighboring memory structures 300 to another of the neighboring memory structures 300, and the curving is free of a singularity. In some embodiments, the interface I1 is a concave surface without a singularity. Since the interface I1 is a concave surface, a bottom of the interface I1 is in a position lower than tops of the memory structures 300. In some embodiments, as illustrated in FIG. 10, the inter-layer dielectric layer 260 can be formed with a top surface 260a smoother than the curved interface I1. Stated differently, the top surface 260a may be free of curving or may have curvature less than curvature of the interface I1. The smooth profile of the top surface 260a can be achieved using one or more parameter of deposition of the inter-layer dielectric layer 260, such as deposition duration of the inter-layer dielectric layer 260.

Figure 11:
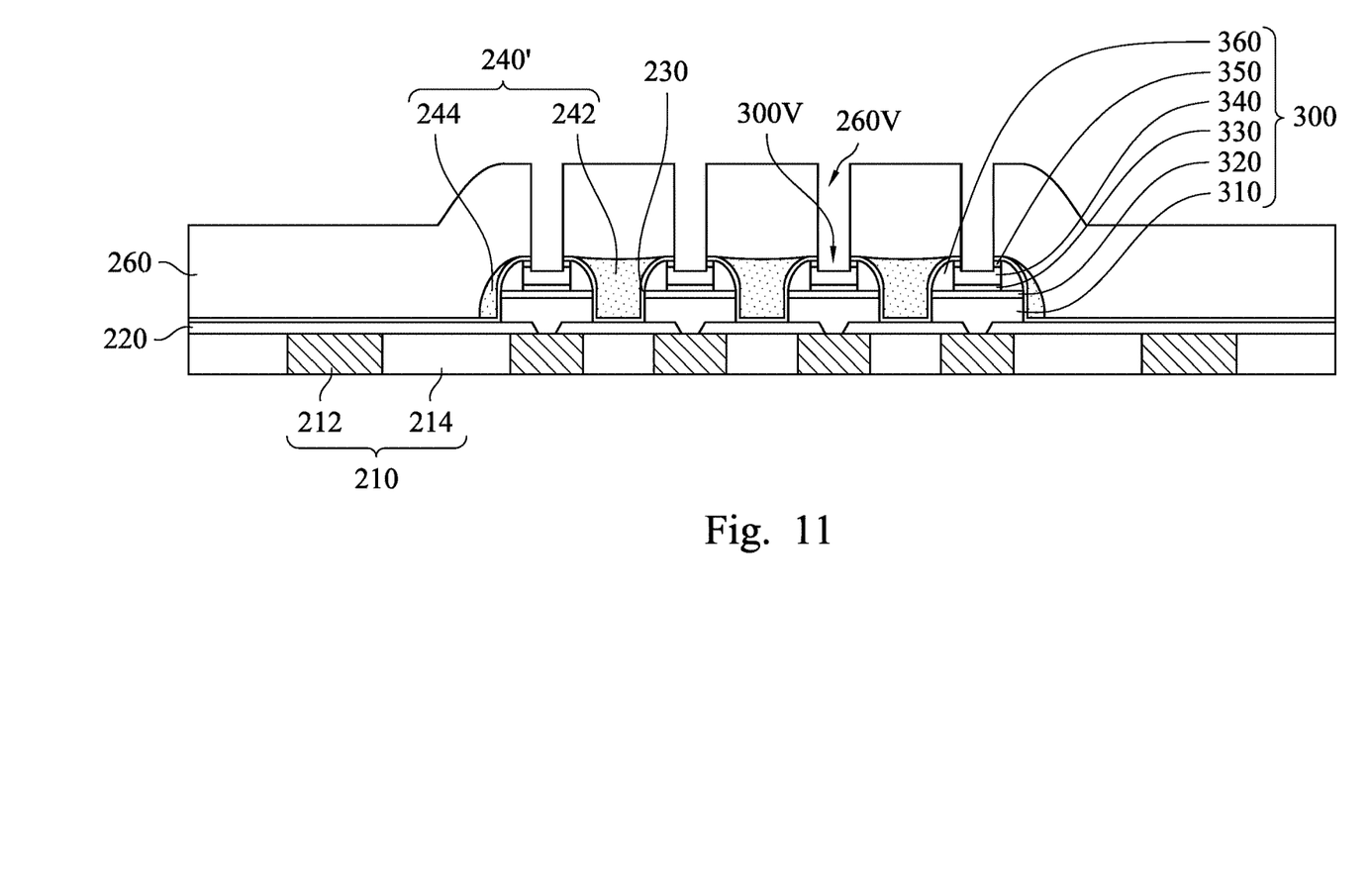

In operation 170 of the method 100, as shown in FIGS. 10 and 11, after the formation of the inter-layer dielectric layer 260, the inter-layer dielectric layer 260 is patterned. In FIG. 10, a first patterned mask layer 270 is deposited over the inter-layer dielectric layer 260. The first patterned mask layer 270 may be a photoresist, in which a portion of the photoresist is exposed to a pattern of light, and being developed. In FIG. 11, the inter-layer dielectric layer 260, the second memory stop layer 230, and the hardmask layer 350 are etched through the first patterned mask layer 270, so that top electrode vias 260V is formed as through holes in the inter-layer dielectric layer 260, and contact vias 300V are formed as through holes in the second memory stop layer 230 and the hardmask layer 350. The contact vias 300V are in communication with the top electrode vias 260V respectively. The inter-layer dielectric layer 260, the second memory stop layer 230, and the hardmask layer 350 may be etched by the same or different etchants. During the etching, the etchant also attacks the top electrode 340 such that by the time the unwanted portions of the hardmask layer 350 are removed, the top electrode 340 may be consumed as well. After the formation of the top electrode vias 260V and contact vias 300V, the first patterned mask layer 270 is removed.

In some embodiments, before the deposition of the first patterned mask layer 270, an anti-reflective layer, such as nitrogen-free anti-reflective coating, is formed on the inter-layer dielectric layer 260. The anti-reflective layer may prevent radiation in a subsequent photolithographic process to reflecting off layers below and interfering with the exposure process.

Figure 12:
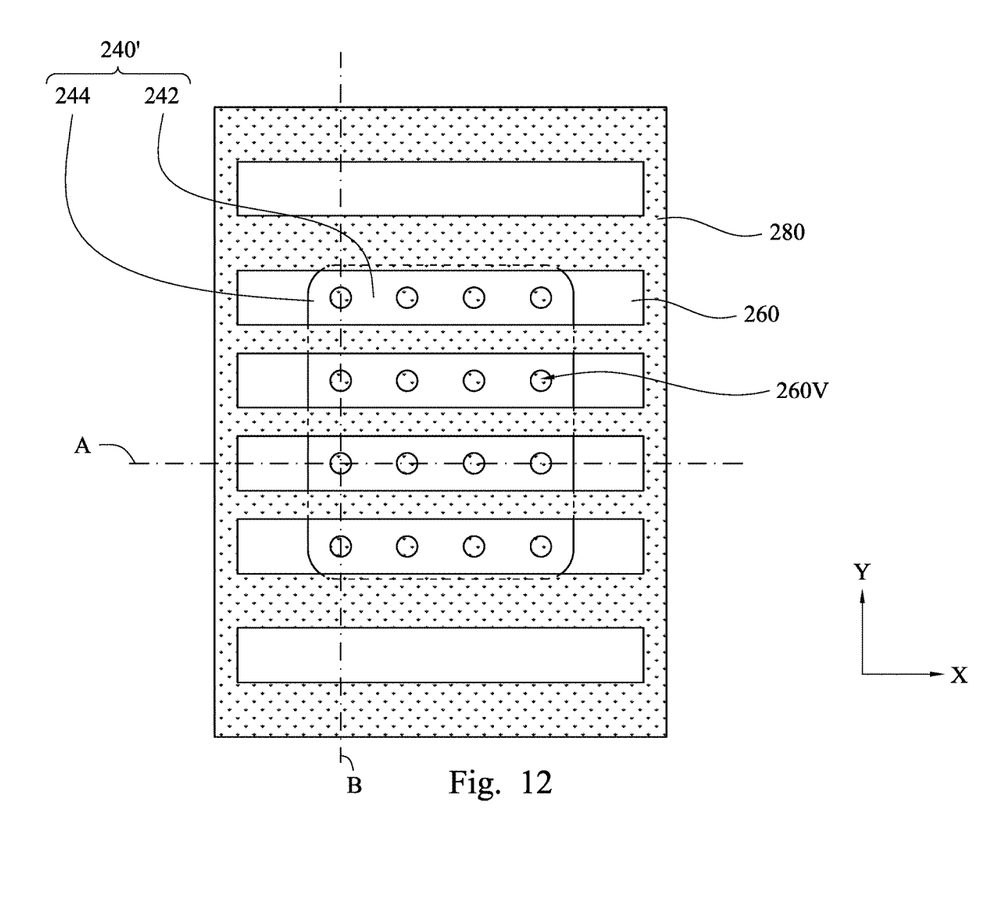
Figure 13A:
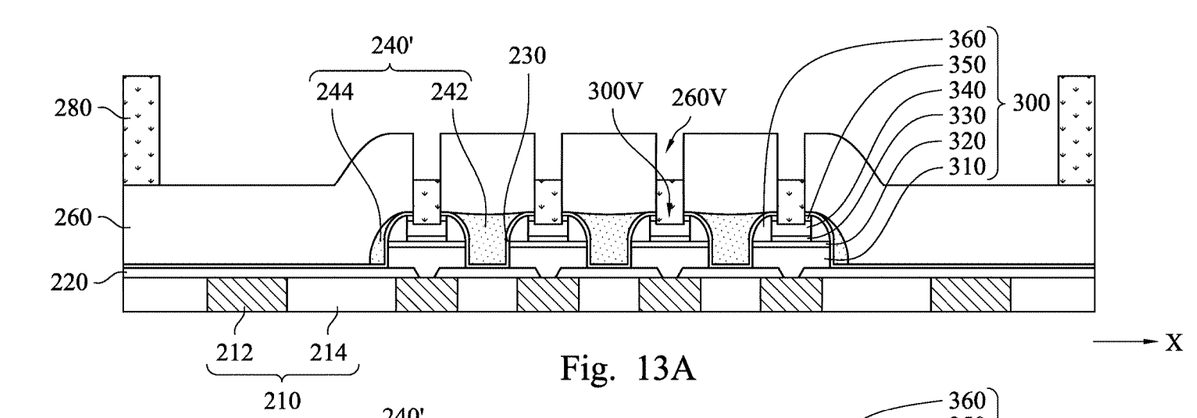
Figure 13B:
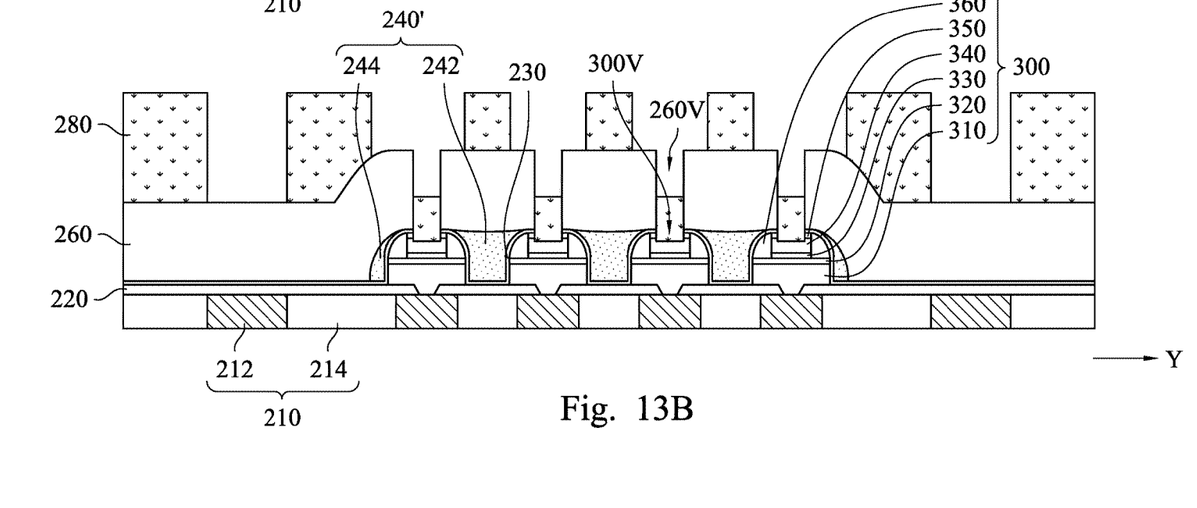

In operation 180 of the method 100, as shown in FIGS. 12, 13A and 13B, a second patterned mask layer 280 is formed over the inter-layer dielectric layer 260. Herein, FIG. 12 illustrates a top view of the intermediate memory device, FIG. 13A is a cross-sectional view taken along line A of FIG. 12, and FIG. 13B is a cross-sectional view taken along line B of FIG. 12.

In FIGS. 12, 13A and 13B, the second patterned mask layer 280 may be present in the top electrode vias 260V and contact vias 300V so as to protect the top electrode 340. The second patterned mask layer 280 may be a photoresist. The first patterned mask layer 270 and the second patterned mask layer 280 may be made of the same material.

Figure 14A:
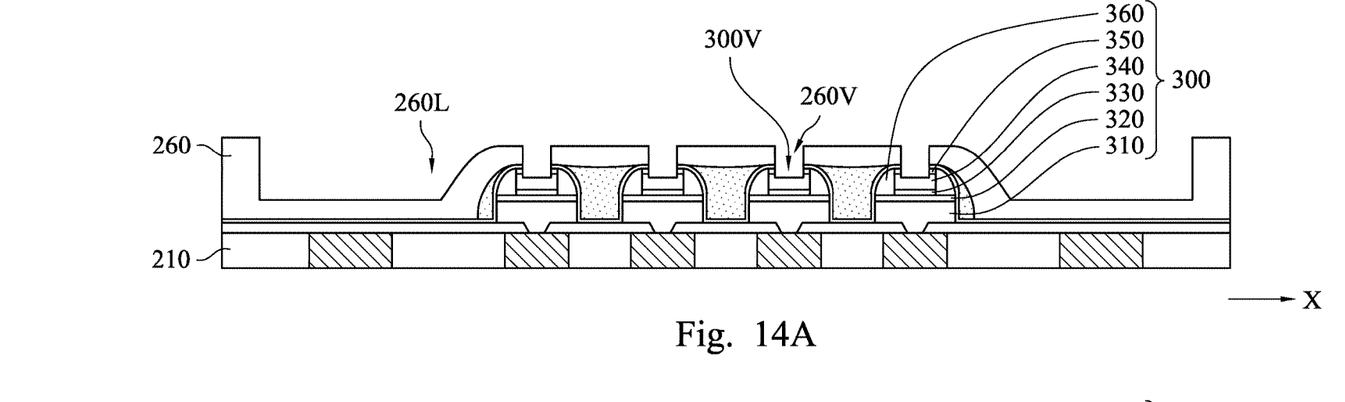
Figure 14B:
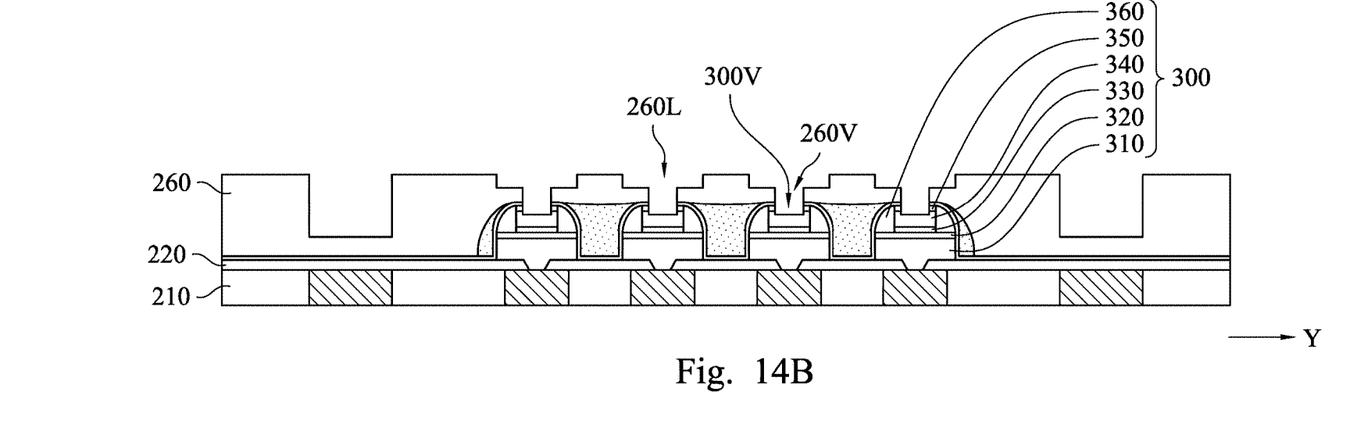

FIG. 14A illustrates a cross-sectional view of the intermediate memory device taken along line A as shown in FIG. 12, and FIG. 14B illustrates a cross-sectional view of the intermediate memory device taken along line B as shown in FIG. 12. In FIGS. 14A and 14B, one or more trenches 260L are etched into portions of the inter-layer dielectric layer 260 exposed by the second patterned mask layer 280 (referring to FIGS. 13A and 13B). The trench 260L is in communication with one or more top electrode vias 260V, as shown in FIG. 14A. In the some embodiments, the depth of the trenches 260L may be less than the depth of the top electrode vias 260V. After the formation of the trenches 260L, the second patterned mask layer 280 is removed.

Figure 15A:
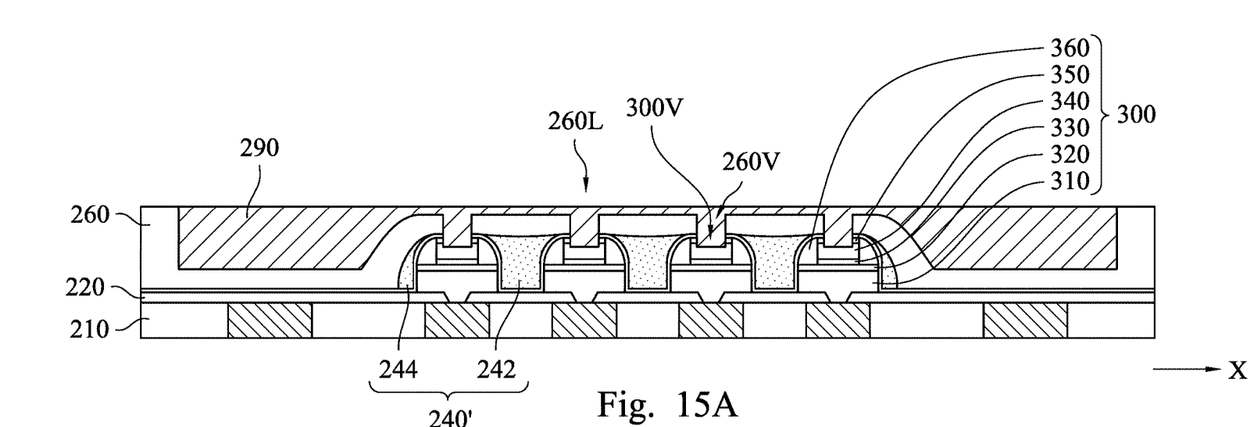
Figure 15B:
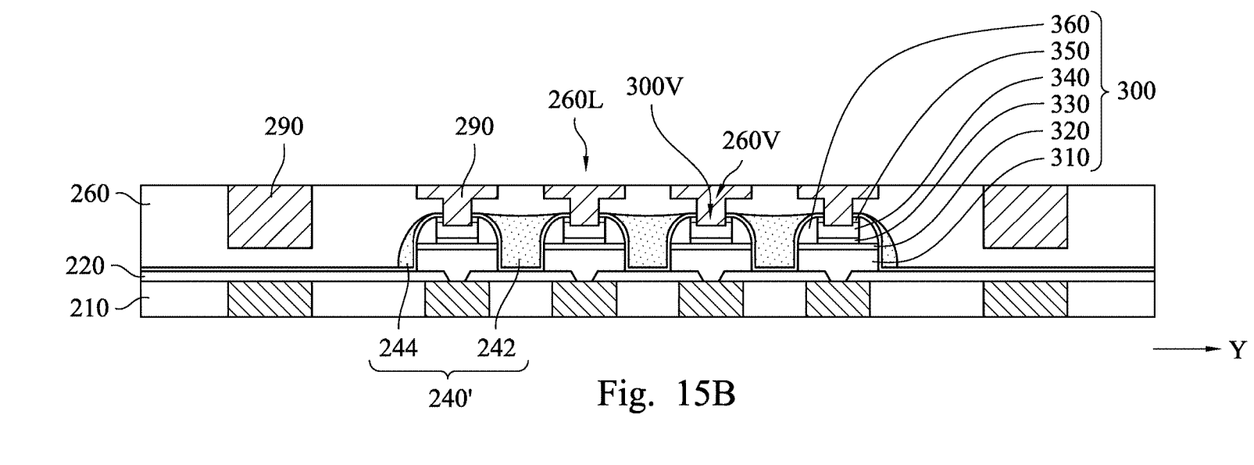

FIG. 15A illustrates a cross-sectional view of the intermediate memory device taken along line A in FIG. 12, and FIG. 15B illustrates a cross-sectional view of the intermediate memory device taken along line B in FIG. 12. In operation 190 of the method 100, as shown in FIGS. 15A and 15B, the contact vias 300V, the top electrode vias 260V, and the trenches 260L are filled with a conductive feature 290, such as a metal. Herein, a portion of the conductive feature 290 in the trench 260L can act as a conductive line extending along direction X. The filling may also include one or more liner and barrier layers in additional a metal conductor. The liner and/or barrier may be conductive and deposited using CVD or PVD. The metal may be deposited using PVD or one of the plating methods, such as electrochemical plating. After the filling, a planarization process, such as chemical mechanical polishing (CMP), is performed to remove excess conductive feature 290.

Figure 16:
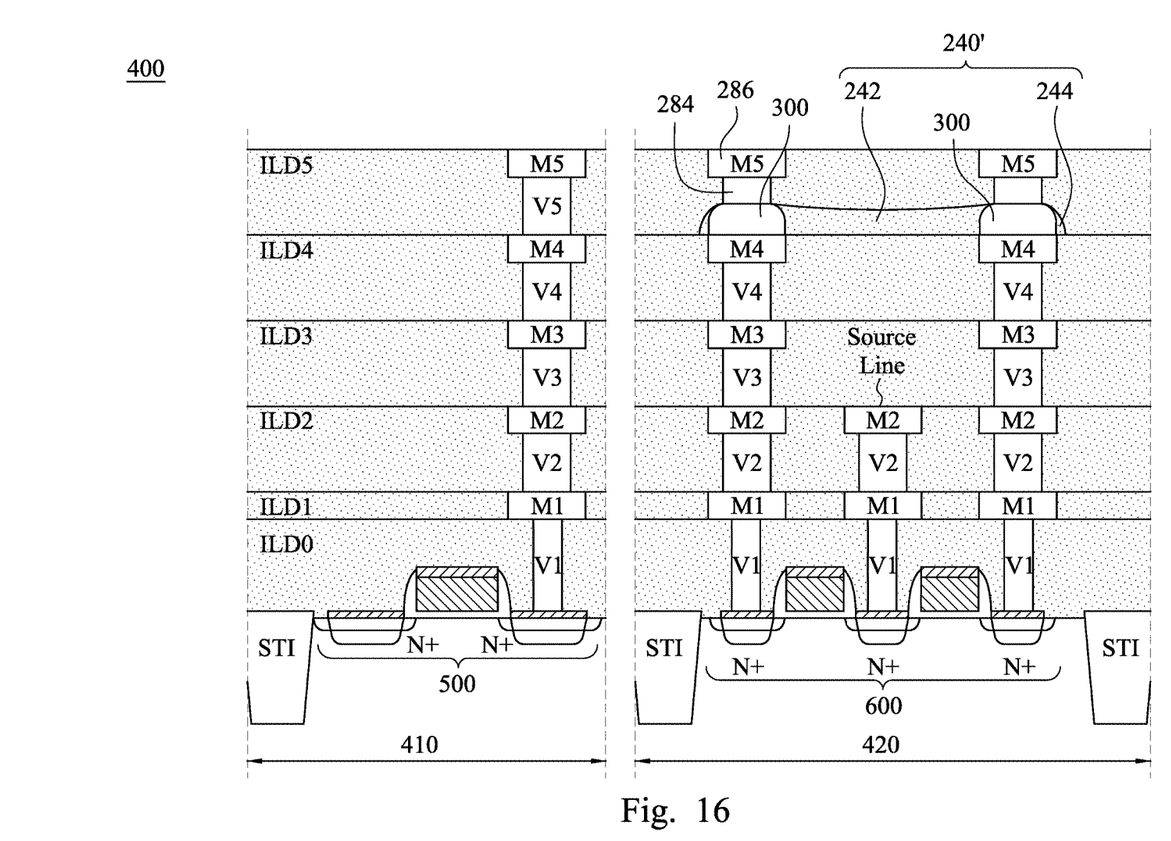
FIG. 16 is a cross-sectional view of a semiconductor device in accordance with some embodiments of the present disclosure.

FIG. 16 is a cross-sectional view of a semiconductor device 400 in accordance with some embodiments of the present disclosure. The semiconductor device 400 includes a logic region 410 and a memory region 420. Logic region 410 may include circuitry, such as an exemplary logic transistor 500, for processing information received from the memory structures 300 in the memory region 420 and for controlling reading and writing functions of the memory structures 300. In some embodiments, the memory structures 300 may be similar to those shown in FIGS. 15A and 15B.

As depicted, the semiconductor device 400 is fabricated using five metallization layers, labeled as M1 through M5, with five layers of metallization vias or interconnects, labeled as V1 through V5. Other embodiments may contain more or fewer metallization layers and a correspondingly more or fewer number of vias. Logic region 410 includes a full metallization stack, including a portion of each of metallization layers M1-M5 connected by interconnects V2-V5, with V1 connecting the stack to a source/drain contact of logic transistor 500. The memory region 420 includes a full metallization stack connecting memory structures 300 to transistors 600 in the memory region 420, and a partial metallization stack connecting a source line to transistors 600 in the memory region 420. Memory structures 300 are depicted as being fabricated in between the top of the M4 layer and the bottom the M5 layer. Also included in semiconductor device 400 is a plurality of ILD layers. Six ILD layers, identified as ILD0 through ILD5 are depicted in FIG. 16 as spanning the logic region 410 and the memory region 420. The ILD layers may provide electrical insulation as well as structural support for the various features of the semiconductor device 400 during many fabrication process steps.

Embodiments of the present disclosure may have at least following advantages. After forming a film layer over a wafer with topography because of the raised memory structures, recesses of the film layer can be filled by a coating layer. Therefore, after etching back of the film layer, a top surface of the remaining film layer can be free of a singularity in between the memory structures. As a result, absence of a singularity in the top surface of the film layer can prevent conductive feature (e.g. M5 layer) from forming in between the memory structures, and hence unwanted electrical issues (e.g. unwanted parasitic capacitance) caused by the conductive material formed in between the memory structures can be prevented.

According to some embodiments of the present disclosure, a memory device includes a first inter-layer dielectric layer, plural conductive features, plural memory structures, a filler, and a second inter-layer dielectric layer. The conductive features are embedded in the first inter-layer dielectric layer. The memory structures are respectively over the conductive features. The filler is in between the memory structures. The second inter-layer dielectric layer is over the filler and the memory structures, and the second inter-layer dielectric layer and the filler form an interface, in which the interface extends from one of the memory structures to another of the memory structures.

According to some embodiments of the present disclosure, a memory device includes a first inter-layer dielectric layer, plural first conductive features, plural memory structures, and a filler. The first conductive features are embedded in the first inter-layer dielectric layer. The memory structures are above the first inter-layer dielectric layer and respectively electrically connected to the first conductive features. The filler is in between the memory structures and has a top surface with edges respectively in contact with the memory structures.

According to some embodiments of the present disclosure, a method for fabricating a memory device includes forming a plurality of memory structures above a first inter-layer dielectric layer; forming a film layer on the memory structures such that the film layer has a recess above a gap between the memory structures; filling the recess of the film layer with a recess filler; and etching back the recess filler and the film layer until reaching the memory structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a plurality of transistors;
    a first inter-layer dielectric layer over the transistors;
    a plurality of first conductive features embedded in the first inter-layer dielectric layer;
    a plurality of memory structures respectively over the first conductive features, wherein each of the memory structures has a top electrode, a bottom electrode coupled electrically to a respective one of the first conductive features, and a resistive material layer sandwiched between the top and bottom electrodes;
    a filler in between the memory structures; and
    a second inter-layer dielectric layer over the filler and the memory structures, the second inter-layer dielectric layer and the filler forming an interface, the interface extending from one of the memory structures to another of the memory structures, wherein the second inter-layer dielectric layer has a first portion over the filler and the memory structures and a second portion around the first portion, and a top surface of the first portion of the second inter-layer dielectric layer is higher than a top surface of the second portion of the second inter-layer dielectric layer.

2. The memory device of claim 1, wherein a bottom of the interface is in a position lower than a top of said one of the memory structures.

3. The memory device of claim 1, wherein the interface is a curved surface, and curving of the interface begins from said one of the memory structures to said another of the memory structures and is free of a singularity.

4. The memory device of claim 3, wherein the top surface of the first portion of the second inter-layer dielectric layer is smoother than the curved surface.

5. The memory device of claim 1, wherein the second inter-layer dielectric layer is free of a singularity.

6. The memory device of claim 1, wherein the filler comprises a sidewall in contact with said one of the memory structures, and wherein the sidewall is concave.

7. The memory device of claim 1, further comprising:
a second conductive feature over the top electrodes of the memory structures, wherein the second conductive feature is in contact with the top surface of the first portion of the second inter-layer dielectric layer and the top surface of the second portion of the second inter-layer dielectric layer.

8. A memory device, comprising:
a plurality of transistors;
a first inter-layer dielectric layer over the transistors;
a plurality of first conductive features embedded in the first inter-layer dielectric layer;
a plurality of memory structures above the first inter-layer dielectric layer, wherein each of the memory structures has a top electrode, a bottom electrode coupled electrically to a respective one of the first conductive features, and a resistive material layer sandwiched between the top and bottom electrodes; and
a filler in between the memory structures, the filler having a top surface with edges respectively in contact with the memory structures, wherein at least one of the edges of the top surface of the filler that is in contact with its corresponding memory structure is higher than a top surface of the resistive material layer of the corresponding memory structure.

9. The memory device of claim 8, wherein the top surface of the filler is free of a singularity.

10. The memory device of claim 8, wherein the top surface of the filler is a concave surface.

11. The memory device of claim 8, wherein a bottom of the top surface of the filler is in a position not higher than a top of one of the memory structures.

12. The memory device of claim 8, further comprising:
a spacer abutting one of the memory structures, wherein the spacer and the filler are made of the same material; and
a second inter-layer dielectric layer on a sidewall of the spacer.

13. The memory device of claim 8, further comprising:
a second inter-layer dielectric layer; and
a second conductive feature embedded in the second inter-layer dielectric layer and electrically connected to one of the memory structures, wherein the second conductive feature is separated from the filler.

14. The memory device of claim 8, wherein the at least one of the edges of the top surface of the filler that is in contact with its corresponding memory structure is higher than a top surface of the top electrode of the corresponding memory structure.

15. A method for fabricating a memory device, comprising:
forming a first inter-layer dielectric layer over a plurality of transistors;
forming a plurality of memory structures above the first inter-layer dielectric layer, wherein each of the memory structures has a top electrode, a bottom electrode, and a resistive material layer sandwiched between the top and bottom electrodes;
forming a film layer on the memory structures such that the film layer has a recess above a gap between the memory structures, wherein a bottom of the recess of the film layer is above a top surface of the top electrode of at least one of the memory structures;
filling the recess of the film layer with a recess filler; and
etching back the recess filler and the film layer until reaching the memory structures.

16. The method of claim 15, wherein an etching rate of the recess filler and an etching rate of the film layer during the etching back are substantially the same.

17. The method of claim 15, wherein the filling the recess comprises forming a flowable material in the recess.

18. The method of claim 15, wherein the filling the recess comprises a coating process.

19. The method of claim 15, further comprising:
forming a second inter-layer dielectric layer on a remaining portion of the film layer;
forming a through hole in the second inter-layer dielectric layer to expose at least one of the memory structures; and
forming a conductive feature in the through hole.

20. The method of claim 15, wherein etching back the recess filler and the film layer is performed such that the recess filler is entirely removed.

* * * * *